US008941018B2

(12) United States Patent
Kunert et al.

(10) Patent No.: US 8,941,018 B2
(45) Date of Patent: Jan. 27, 2015

(54) CONNECTING ELEMENT AND METHOD FOR MANUFACTURING A CONNECTING ELEMENT

(75) Inventors: Peter Kunert, Lichtenstein (DE); Michael Hortig, Eningen U.A. (DE); Timo Nachtrab, Kirchentellinsfurt (DE); Matthias Ludwig, Moessingen (DE)

(73) Assignee: Robert Bosch GmbH, Stuttgart (DE)

( * ) Notice: Subject to any disclaimer, the term of this patent is extended or adjusted under 35 U.S.C. 154(b) by 119 days.

(21) Appl. No.: 13/431,286

(22) Filed: Mar. 27, 2012

(65) Prior Publication Data

US 2012/0285735 A1 Nov. 15, 2012

(30) Foreign Application Priority Data

Mar. 30, 2011 (DE) ........................ 10 2011 006 392

(51) Int. Cl.
*H01L 23/48* (2006.01)
*H01R 13/405* (2006.01)
*H01R 43/24* (2006.01)
*H01R 43/16* (2006.01)

(52) U.S. Cl.
CPC .............. *H01R 13/405* (2013.01); *H01R 43/24* (2013.01); *H01R 43/16* (2013.01)
USPC ............................ 174/532; 174/541; 439/606

(58) Field of Classification Search
USPC .......... 174/521, 532, 50.52, 541, 59; 439/606
See application file for complete search history.

(56) References Cited

U.S. PATENT DOCUMENTS

| | | | | |
|---|---|---|---|---|
| 4,043,630 | A * | 8/1977 | Suverison et al. | 439/606 |
| 5,662,484 | A * | 9/1997 | Blanche | 439/106 |
| 6,307,749 | B1 * | 10/2001 | Daanen et al. | 361/704 |
| 7,955,128 | B2 * | 6/2011 | Shultz et al. | 439/606 |
| 8,366,457 | B2 * | 2/2013 | Yamamoto et al. | 439/76.2 |
| 2009/0305556 | A1 * | 12/2009 | Kawahara et al. | 439/544 |
| 2011/0147075 | A1 * | 6/2011 | Sugai | 174/520 |

FOREIGN PATENT DOCUMENTS

DE 10 2006 062 311 7/2008

* cited by examiner

*Primary Examiner* — Hung V Ngo
(74) *Attorney, Agent, or Firm* — Kenyon & Kenyon LLP

(57) ABSTRACT

A connecting element for electrical contacting of an electrical component having at least one electrically conductive line part, embedded at least partially in an injection-molded housing, is provided, the connecting element having at least one stiffening element reinforcing the line part.

3 Claims, 4 Drawing Sheets

CONNECTING ELEMENT AND METHOD FOR MANUFACTURING A CONNECTING ELEMENT

BACKGROUND INFORMATION

Connecting elements are known in general. For example, a housing having a metallic insert is known from German Patent No. DE 10 2006 062 311, in which the metallic insert is at least partially enclosed by the housing. The metallic insert is used for contacting electrical components integrated into the housing. One portion of the metallic insert functions as a circuit board area to receive the electrical component and another portion of the metallic insert functions as a plug area, via which the electrical component is contactable from the outside. The housing protects the insert and the electrical components from external environmental influences. The housing is manufactured in a plastic injection molding method in which the insert and optionally also the electrical component are partially extrusion-coated with plastic. In this way, sensor and circuit modules for safety equipment may be installed in vehicles, which are provided for measuring decelerations and/or tilt angles of the vehicle, for example. In the integration of sensors which measure vectorial variables such as acceleration, rotational acceleration, magnetic fields and/or electrical fields there is fundamentally a need for a precise alignment of the sensing elements, including mechanical, micromechanical, electrical and/or Hall Effect sensor elements, for example. During extrusion-coating of the metallic insert with plastic to form the housing, there is the risk that the metallic insert may be bent or twisted due to the flow of the plastic, thereby altering the original position of the sensor.

SUMMARY OF THE INVENTION

The connecting element according to the present invention and the method according to the present invention for manufacturing a connecting element have the advantage over the related art that during the injection molding operation for manufacturing the housing, the line part is reinforced and stiffened with the aid of the stiffening element in such a way that bending or torsion of the line part due to the injection molding operation is mostly suppressed. Mechanical stresses in the material of the line part are thus advantageously prevented, thereby increasing the lifetime of the connecting element on the one hand, and increasing the tightness of the connecting element, in particular at the transitions between the line part and the housing, on the other hand. In addition, assembly tolerances are minimized, so that the position and alignment of the electrical component are not impaired. When using a sensor as an electrical component in particular, an increase in the measuring accuracy obtainable with the sensor is thus achieved. The line part preferably includes a metallic insert, which is at least partially enclosed by the housing. The electrical component preferably includes a mechanical, a micromechanical, an electrical, an electronic and/or a Hall effect sensor element. It is optionally conceivable that the electrical component includes an additional internal housing. For example, the electrical component has an SOIC or LGA design or the like. Alternatively, the stiffening element is connected to the line part either permanently or only temporarily (essentially only for the duration of the injection molding operation). The connecting element preferably has a plurality of stiffening elements.

According to one preferred specific embodiment of the present invention, it is provided that the stiffening part includes a bent area of the line part. The stiffening part is preferably designed in one piece with the line part. Thus a comparatively simple and inexpensive manufacture of the stiffening part is advantageously possible, in which one area of the line part is simply bent over, for example. This creates a bending edge or a fold in particular, so that a substantial reinforcement of the line part is achieved. The line part therefore has an L-shaped cross section in the area of the bent area in particular.

According to one preferred specific embodiment of the present invention, it is provided that the line part includes a plug area and a sheathing area, the bent area being situated in the sheathing area. The line part is sheathed only in the sheathing area directly by the housing in particular, there being at least no direct mechanical contact in the plug area between the housing and the line part. During the injection molding operation for producing the housing, a mechanical force is therefore exerted on the line part only in the sheathing area, so that it is sufficient to reinforce the line part only in the sheathing area. A structural change in the line part in the plug area is therefore advantageously unnecessary, so that the connecting element according to the present invention is still compatible with standardized plug shapes.

According to one preferred specific embodiment of the present invention, it is provided that the stiffening part includes a separate plastic part, preferably being situated in a holding area between the plug area and the sheathing area and/or being connected to the line part in a form-locked manner. The line part is advantageously reinforced with the aid of the separate stiffening part manufactured from plastic. The stiffening part is preferably simply attached to the line part and in particular is not manufactured by extrusion-coating of the line part, so that unintentional bending of the line part by the stiffening part need not be feared. The stiffening part includes, for example, a premolded plastic part. Due to a form lock between the plastic part and the line part, unintentional bending or torsion of the line part during the injection molding process for manufacturing the housing is prevented. It is conceivable that the plastic part is also sheathed during the injection molding operation. It is optionally conceivable that the line part is reinforced by a stiffening element designed in the form of the bent area as well as by the stiffening element manufactured separately of plastic.

According to one preferred specific embodiment of the present invention, it is provided that the line part has a receiving area for receiving the electrical component, in particular a sensor element, the receiving area being preferably situated between two stiffening elements and in particular between two bent areas. The receiving area is used to fasten the electrical component. The receiving area and the electrical component are preferably sheathed during the injection molding operation for manufacturing the housing, so that the housing protects the electrical component from external environmental influences such as mechanical force effects, moisture, soiling and the like. The optional configuration of the receiving area between at least two stiffening elements and in particular between two bent areas has the advantage that bending or torsion of the line part is effectively prevented precisely in the sensitive area of the electrical component.

Another subject matter of the present invention is a method for manufacturing a connecting element for electrical contacting of an electrical component, so that in a first method step, a line part is provided; in a second method step, the line part is reinforced with the aid of at least one stiffening element; and in a third method step, the line part is at least partially extrusion-coated to form a housing. The stiffening element is advantageously used to reinforce the line part during the third method step, so that bending or torsion of the line part due to the injection molding operation for manufacturing the housing is largely prevented. In the first method step, the line part is preferably provided with the electrical component, which is particularly preferably situated, glued, soldered and/or attached on/to a receiving area of the line part. Alternatively, it is conceivable that the electrical component is inserted into a socket situated in the receiving area. Alternatively, the stiffening element is either permanently or only temporarily connected to the line part. It is thus conceivable that the stiffening part is designed in one piece with the line part, is fixedly connected (for example, in a form-locked manner) to the line part as a separate stiffening part or is designed as part of the injection molding tool.

According to one preferred specific embodiment of the present invention, it is provided that the line part in the second method step is bent at least partially to form a bent area which functions as a stiffening element. A comparatively simple and inexpensive manufacture of the stiffening element is thus advantageously achieved because the line part need only be bent. A substantial reinforcement of the line part is achieved due to the resulting fold.

According to one preferred specific embodiment of the present invention, it is provided that the line part in the second method step is connected in a form-locked manner to a plastic part, which functions as a stiffening element, the plastic part being preferably attached to the line part and/or the line part being inserted into the plastic part. The separate plastic part advantageously creates a reinforcement of the line part. It is optionally conceivable for the line part to be reinforced by a stiffening element designed in the form of the bent area as well as by the separate stiffening element made of plastic.

According to one preferred specific embodiment of the present invention, it is provided that the line part is secured in the area of the stiffening element during the third method step. This achieves a mechanically stable fixation of the line part during the injection molding operation, in which the risk of bending or torsion of the line part is minimized. Using the separate plastic part also has the advantage that additional holding and gripping surfaces are created for fixation of the connecting element during the injection molding operation. A clamping hold of the connecting element on the separate plastic part during the injection molding operation is possible in particular without resulting in any metallic abrasion on the line part. It is conceivable that a full-area or partial-area support of the separate plastic part in the sheathing tool is achieved by a form lock. Due to the full utilization of the plug base, a maximum support of the line part in the sheathing tool is then achieved.

According to one preferred specific embodiment of the present invention, it is provided that the line part is reinforced with the aid of a stiffening element surrounding the line part at least partially in a form-locked manner in the second method step, the stiffening element being again removed from the line part in a fourth method step following the third method step. A comparatively compact connecting element is implementable in this way, in which reinforcement of the line part during the injection molding operation for manufacturing the housing may nevertheless be achieved. The separate stiffening element is placed on the plug area of the line part prior to the injection molding operation in particular and is then removed again after the injection molding operation.

DETAILED DESCRIPTION

Figure 1:
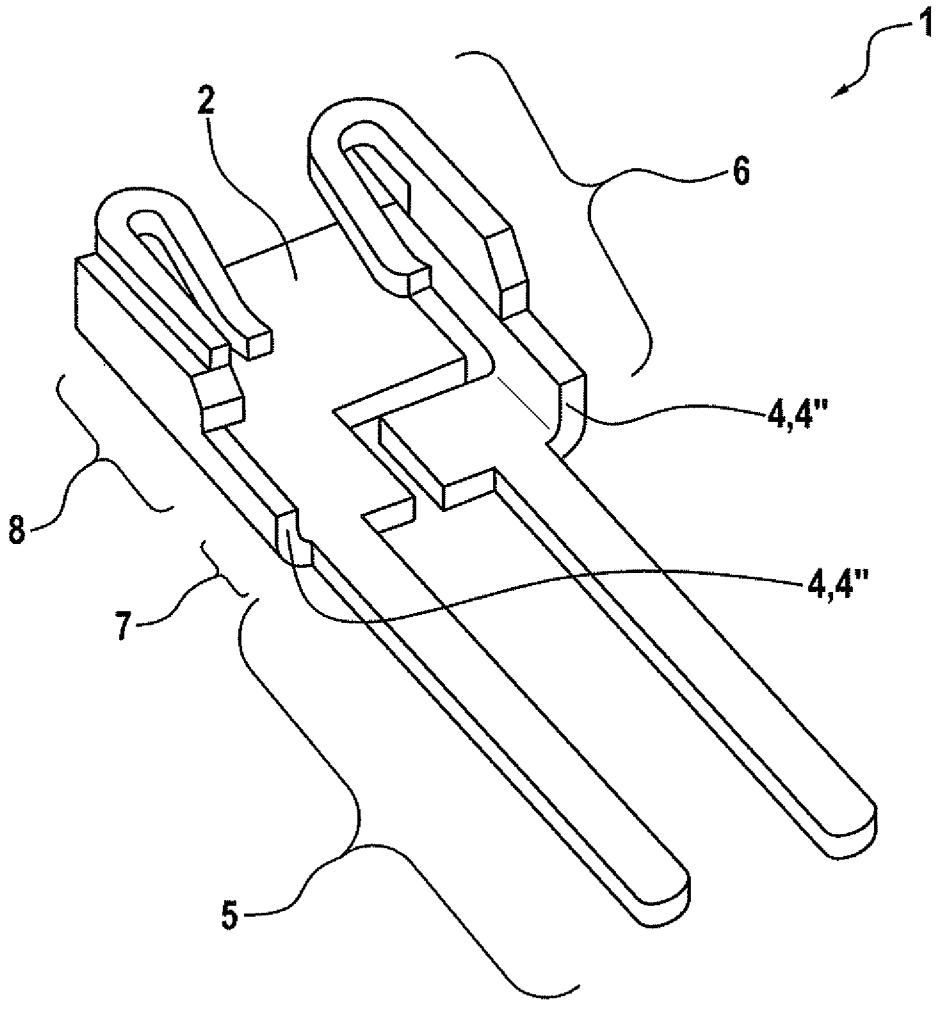
FIG. 1 shows a schematic perspective view of a connecting element according to a first specific embodiment of the present invention.

In the various figures, the same parts are always provided with the same reference numerals and therefore are usually only mentioned or discussed once.

FIG. 1 shows a schematic perspective view of a connecting element 1 for electrical contacting of an electrical component 9 according to a first specific embodiment of the present invention. Connecting element 1 includes a line part 2, which includes in particular a metallic insert. Line part 2 has a plug area 5, a sheathing area 6 and a receiving area 8. Receiving area 8 receives electrical component 9, which is preferably glued or soldered onto receiving area 8 using an electrically conductive adhesive. Plug area 5 includes, for example, two contact pins, which are provided for removable insertion into corresponding female plugs of a mating plug element (not shown). Electrical component 9 (not shown in FIG. 1 for reasons of clarity) preferably includes a sensor element 9' in the form of a micromechanical acceleration sensor for an automotive safety system, such as an electronic stability program (ESP), an airbag deployment unit or the like. Electrical component 9 is contactable from the outside via line part 2, i.e., electrical component 9 is supplied with current via line part 2 for example, and/or sensor data are transmitted via line part 2 from electrical component 9 to an evaluation unit. Electrical component 9 is in particular tied into a communication network of the motor vehicle, for example, a CAN (controller area network) system via line part 2. Line part 2 therefore preferably includes at least two electrically insulated line part elements.

To protect line part 2 and electrical component 9, line part 2 is sheathed at least partially with a housing 3. Housing 3 is not illustrated in FIG. 1 for reasons of graphical presentability. Housing 3 is created in an injection molding operation in that line part 2 is extrusion-coated with plastic at least in sheathing area 6. Receiving area 8 in particular and electrical component 9, which is situated in receiving area 8, are extrusion-coated with the plastic in this operation. Line part 2 is exposed to mechanical forces during the injection molding operation due to the flow of the plastic, and these forces may result in bending or torsion of line part 2, whereby stresses occur in the material of line part 2, possibly impairing the lifetime and tightness of connecting element 1. Furthermore, there is the risk that the alignment and position of electrical component 9 may change.

Connecting element 1 according to the present invention is equipped with two stiffening elements 4, 4" to protect against such undesirable bending or torsion; in the present exemplary embodiment, these elements are designed as bent areas of line part 2. The material of line part 2 is bent essentially at a right angle in the edge area of sheathing area 6, so that line part 2 here has an L-shaped cross section. Line part 2 is substantially stiffened and reinforced by the bent areas in sheathing area 6, so that the risk of bending or torsion of line part 2 during the injection molding operation is greatly reduced. Alternatively, however, it is also conceivable that the bent area may be bent by a smaller or a greater angle with respect to receiving area 8. An area bent by 180°, forming a closed fold (also referred to as an envelope) would also be conceivable. The bent area optionally extends over the entire sheathing area 6 and thus also over the entire length of receiving area 8. A holding area 7 on which line part 2 is held during the injection molding operation is created between receiving area 8 and plug area 5. The bent area preferably also extends over holding area 7, so that it is possible to hold line part 2 at the two bent areas during the injection molding operation and thus effectively prevent bending of line part 2 due to the fixation during the injection molding operation.

Figure 2:
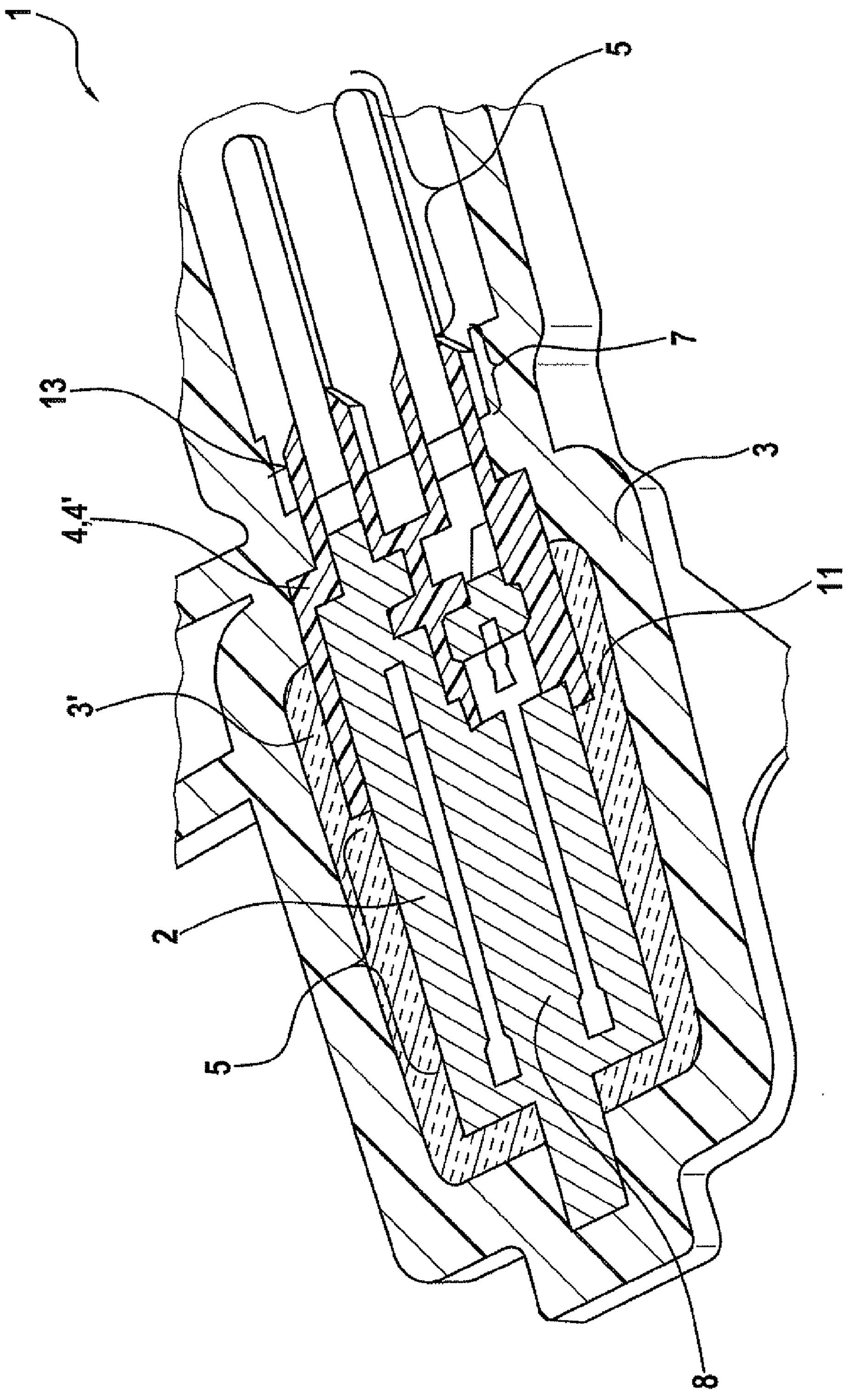
FIG. 2 shows a schematic perspective sectional view of a connecting element according to a second specific embodiment of the present invention.

FIG. 2 shows a schematic perspective sectional view of a connecting element 1 according to a second specific embodiment of the present invention. The second specific embodiment corresponds essentially to the first specific embodiment, which is illustrated in FIG. 1, where connecting element 1 according to the second specific embodiment has a stiffening element 4, which is designed as a separate plastic part 12. Prefabricated plastic part 12 is pushed onto line part 2 in such a way that it is situated in holding area 7 between receiving area 8 and plug area 5. Line part 2 is secured here in a form-locked manner by plastic part 4', so that bending or torsion of line part 2 during the injection molding operation for manufacturing housing 3 is prevented. In particular, the plastic is not extruded directly in holding area 7 during the injection molding operation but instead is extruded only indirectly onto line part 2 since stiffening element 4, 4' between line part 2 and housing 3 is situated in holding area 7. In the present example, electrical component 9 is sheathed by an inner housing 11, which is situated between housing 3 and receiving area 8 of line part 2 in the sectional diagram in FIG. 2. Electrical component 9 and inner housing 11 are implemented as SOIC or LGA designs, for example. According to the second specific embodiment, connecting element 1 does not have any bent areas, in contrast with the first specific embodiment. Plastic part 12 also provides holding faces 13, which enable holding of line part 2 in a sheathing tool 10, for example, by clamping plastic part 12 during the injection molding operation for creating housing 3, without the risk of damage to line part 2 or in particular any fear of metallic abrasion.

Figure 3A:
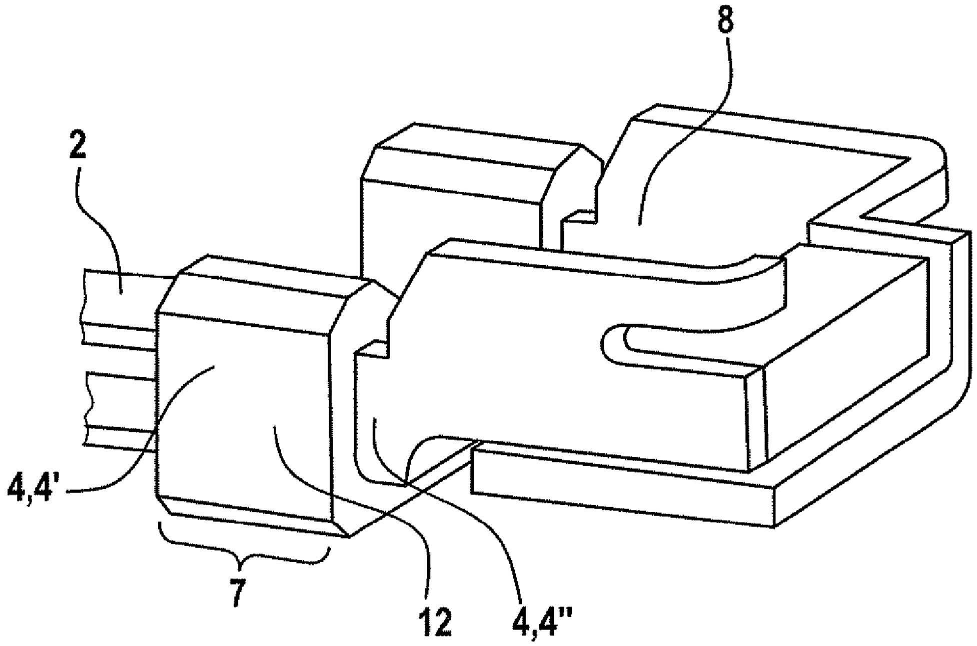
FIGS. 3*a*, 3*b* and 3*c* show schematic perspective views of a connecting element according to a third specific embodiment of the present invention.
Figure 3B:
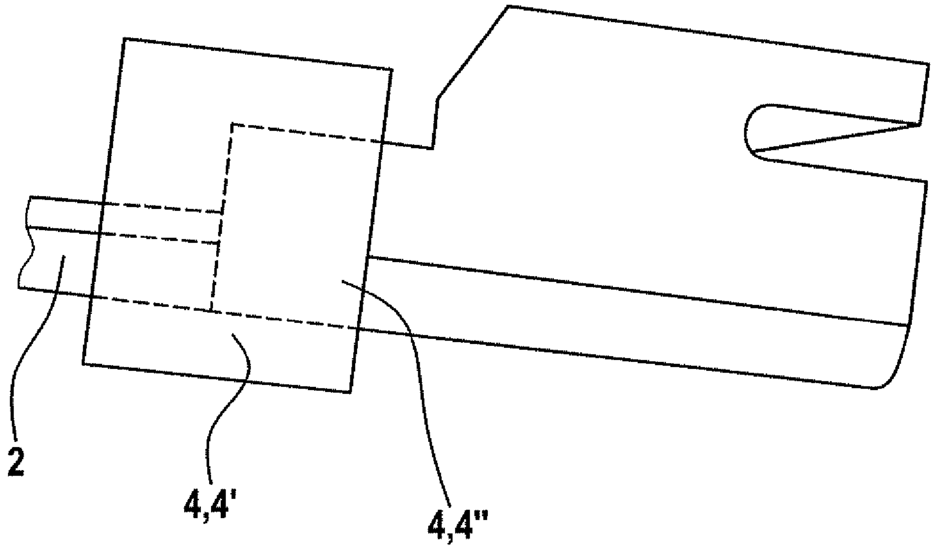
Figure 3C:
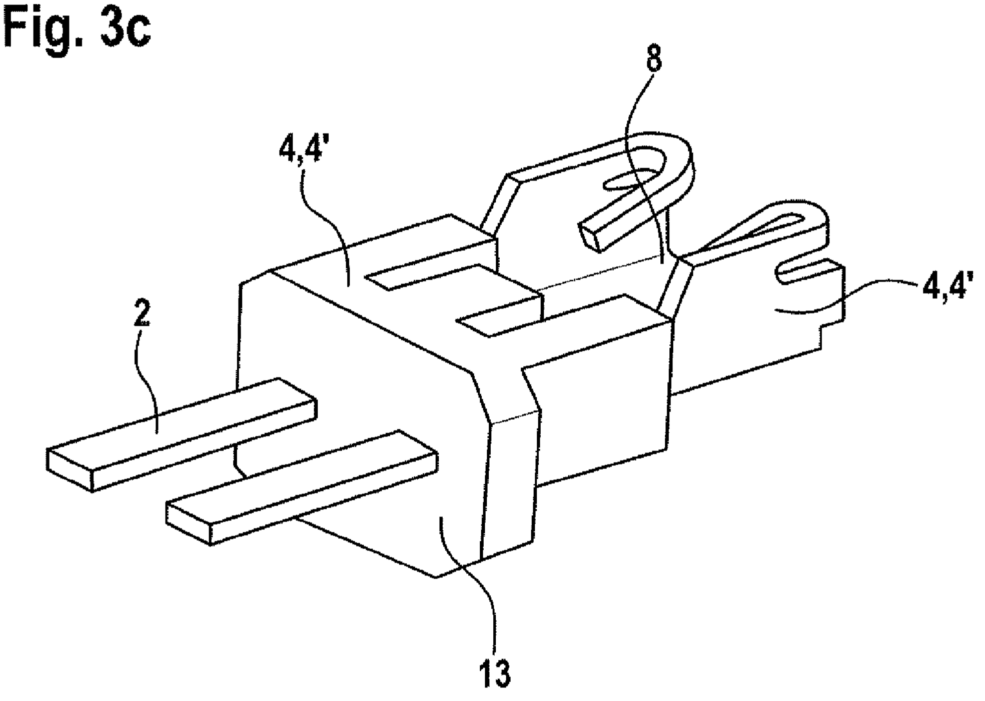

FIGS. 3*a*, 3*b* and 3*c* show schematic perspective views of a connecting element 1 according to a third specific embodiment of the present invention. The third specific embodiment corresponds essentially to a combination of the first and second specific embodiments illustrated in FIGS. 1 and 2. Connecting element 1 therefore includes both stiffening elements 4, 4', which are designed in the form of bent areas of line part 2 as well as a separate stiffening element 4, 4', which is designed in the form of a separate plastic part 12.

Figure 4:
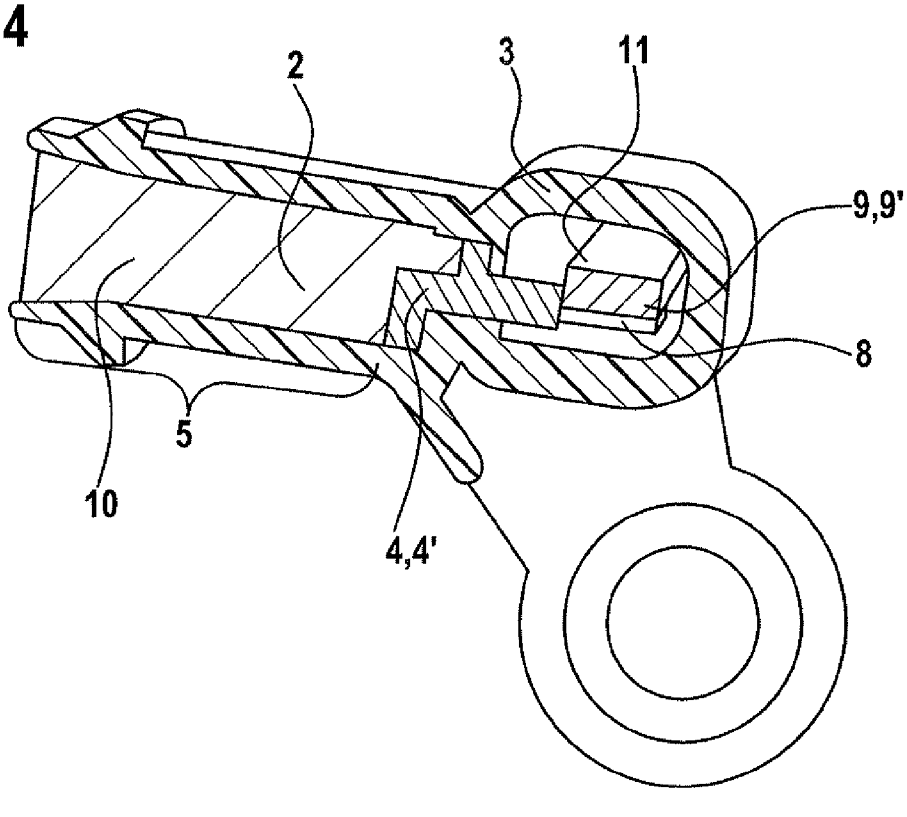
FIG. 4 shows a schematic sectional view of a connecting element according to a fourth specific embodiment of the present invention.

FIG. 4 shows a schematic perspective view of a connecting element 1 according to a fourth specific embodiment of the present invention, which is essentially identical to the second specific embodiment illustrated in FIG. 2. Connecting element 1 is shown in a position immediately following the injection molding operation, in which plug area 5 of line part 2 is plugged onto a holding part of a sheathing tool 10. The holding part receives line part 2 in a form-locked manner, so that on the one hand, line part 2 is held and on the other hand, bending of line part 2 in plug area 5 is prevented. In a subsequent manufacturing step, which is not shown here, connecting element 1 is removed from sheathing tool 10. Sheathing tool 10 thus also constitutes a stiffening part 4, 4' in the sense of the present invention, because line part 2 is reinforced by sheathing tool 10 during the injection molding operation by a form lock even if it is removed from line part 2 after the manufacturing operation.

What is claimed is:

1. A connecting element for electrical contacting of an electrical component, comprising:

an injection-molded housing;

at least one electrically conductive line part embedded at least partially in the injection-molded housing; and at least one stiffening element reinforcing the line part, wherein the stiffening element includes a bent area of the line part, and wherein the line part has a receiving area for receiving the electrical component, including a sensor element, the receiving area being situated between two bent areas.

2. The connecting element according to claim 1, wherein the line part includes a plug area and a sheathing area, the bent area being situated in the sheathing area.

3. A connecting element for electrical contacting of an electrical component, comprising:

an injection-molded housing;

at least one electrically conductive line part embedded at least partially in the injection-molded housing; and at least one stiffening element reinforcing the line part, wherein the stiffening element includes a bent area of the line part, wherein the line part includes a plug area and a sheathing area, the bent area being situated in the sheathing area, wherein the stiffening element includes a plastic part, which is situated in a holding area between the plug area and the sheathing area and is connected to the line part in a form-locked manner.

* * * * *